United States Patent [19]

Umotoy et al.

[11] Patent Number: 5,766,365
[45] Date of Patent: Jun. 16, 1998

[54] REMOVABLE RING FOR CONTROLLING EDGE DEPOSITION IN SUBSTRATE PROCESSING APPARATUS

[75] Inventors: Salvador P. Umotoy, Antioch; Alan F. Morrison, San Jose; Karl A. Littau, Palo Alto; Richard A. Marsh, Austin; Lawrence Chung-Lai Lei, Milpitas, all of Calif.

[73] Assignee: Applied Materials, Inc., Santa Clara, Calif.

[21] Appl. No.: 472,220

[22] Filed: Jun. 7, 1995

Related U.S. Application Data

[63] Continuation-in-part of Ser. No. 200,862, Feb. 23, 1994, and a continuation-in-part of Ser. No. 327,462, Oct. 21, 1994, Pat. No. 5,556,476, and Ser. No. 342,670, Nov. 21, 1994, Pat. No. 5,516,367.

[51] Int. Cl.⁶ .................................................. C23C 16/00
[52] U.S. Cl. ........................... 118/728; 118/500; 156/345; 427/248.1
[58] Field of Search ........................ 118/728, 500; 156/345; 427/248.1

[56] References Cited

U.S. PATENT DOCUMENTS

| | | | |
|---|---|---|---|
| 4,854,263 | 8/1989 | Chang | 118/715 |
| 5,238,499 | 8/1993 | Van De Ven | 118/724 |
| 5,292,554 | 3/1994 | Sinha | 427/251 |
| 5,304,248 | 4/1994 | Cheng | 118/728 |
| 5,326,725 | 7/1994 | Sherstinsky | 437/225 |
| 5,437,757 | 8/1995 | Rice | 156/345 |
| 5,476,548 | 12/1995 | Lei | 118/728 |
| 5,516,367 | 5/1996 | Lei | 118/725 |
| 5,534,072 | 7/1996 | Mizuno | 118/728 |
| 5,556,476 | 9/1996 | Lei | 118/728 |

*Primary Examiner*—Richard Bueker
*Assistant Examiner*—Jeffrie R. Lund
*Attorney, Agent, or Firm*—Cooley Godward LLP; Craig P. Opperman

[57] ABSTRACT

A substrate processing apparatus comprising a processing chamber in which a substrate support is located. The substrate support, which is in the form of a heater pedestal, has a surface dimensioned to receive the substrate, and is circumscribed by a removable purge ring which defines an annulus between itself and the pedestal. At the outer edge of the pedestal is a purge gas manifold, in the form of a cavity between the purge ring and the pedestal. The lower end of the manifold is sealed by means of a mechanical seal that is formed at process temperature as the pedestal expands from heating and comes into contact with the purge ring's lower edge. The upper end of the manifold opens into the annulus defined by the purge ring and the pedestal. The manifold is arranged so that during processing, purge gas is injected into the manifold and projected toward the edge of a substrate received on the surface of the pedestal. This gas moves upwards through the annulus defined between the purge ring and the substrate support. Consequently, processing gas is prevented from contacting the extreme edge portion of the substrate. This reduces unwanted deposition on the peripheral edge and lower surface of the substrate.

16 Claims, 4 Drawing Sheets

REMOVABLE RING FOR CONTROLLING EDGE DEPOSITION IN SUBSTRATE PROCESSING APPARATUS

CROSS-REFERENCE TO RELATED APPLICATIONS

This application is a continuation in part of U.S. patent application Ser. No. 08/200,862 filed on Feb. 23, 1994, and titled "Improved Chemical Vapor Deposition Chamber," and of U.S. patent application Ser. No. 08/327,462 filed on Oct. 21, 1994, now issued as U.S. Pat. No. 5,556,476 and titled "Controlling Edge Deposition on Semiconductor Substrates," and of U.S. patent application Ser. No. 08/342,670 filed on Nov. 21, 1994 now issued as U.S. Pat. No. 5,516,367, and titled "Chemical Vapor Depositing Chamber With a Purge Guide," the specifications of which are hereby incorporated by reference.

BACKGROUND

1. Technical Field

This invention relates to a method and apparatus for depositing useful layers of materials on substrates used in the manufacture of semiconductor die. More particularly, this invention relates to an improvement to a wafer heater pedestal used in such deposition process.

2. Background

Chemical vapor deposition, commonly referred to as "CVD," is one of a number of processes used to deposit thin layers of material on a semiconductor substrate. To process deposition substrates with the CVD process, a vacuum chamber is provided with a susceptor configured to receive a substrate thereon. In a typical prior art CVD chamber, the substrate is placed into and removed from the chamber by a robot blade and is supported by the susceptor during processing. Prior to processing the susceptor and the substrate are heated to a temperature of between 250°–650° C. Once the substrate is heated to an appropriate temperature, a processing gas is charged to the vacuum chamber through a gas manifold often situated above the substrate. The processing gas reacts with the heated substrate surface to deposit a thin material layer thereon. As the gas thermally reacts to form the material layer, volatile byproduct gasses are formed, and these by product gasses are pumped out of the vacuum chamber through a chamber exhaust system.

A primary goal of substrate processing is to obtain as many useful die as possible from each substrate. Many factors influence the processing of substrates in the CVD chamber and affect the ultimate yield of die from each substrate processed therein. These factors include processing variables, which affect the uniformity and thickness of the material layer deposited on the substrate, and contaminants that can attach to a substrate and contaminate one or more die therein. Both of these factors must be controlled in CVD and other processes to maximize the die yield from each substrate.

One of the causes of particulate contaminants in the chamber is improper deposition at the edge of a substrate. Because edge deposition conditions are difficult to control, due in part to the fact that substrate edges are typically chamfered and deposition gas flow is non-uniform around these edges, non-uniform deposition can occur around a substrate's edge. This may lead to deposited layers not adhering properly to each other and/or not adhering properly to the substrate.

This problem is illustrated in FIG. 1(a) which is a schematic partial cross-section of a typical semiconductor substrate. For this example, the substrate 1 is shown with three consecutive layers 2, 3, and 4 deposited thereon. Metals such as aluminum can be deposited on the substrate as the upper layer 4 after depositing intermediate layers 2 and 3 (or more layers, if necessary) on the substrate. As an illustrative, non-limiting example, in the deposition of tungsten on the substrate using $WF_6$ gas, the first layer 2 would typically be titanium, the second layer 3 would be titanium nitride, and the third (upper) layer 4 would be tungsten.

Such a three-layer process for the deposition of tungsten is common as tungsten does not readily adhere to the silicon (or oxidized silicon) surface of the substrate. Accordingly a very thin "primer" layer 2 of titanium is deposited, followed by a second layer 3 of titanium nitride. Tungsten readily adheres to titanium nitride (TiN). As can be seen from FIG. 1(a), however, the tungsten layer 4 has "wrapped" around onto the beveled outer edge 5 of the substrate to contact directly with the silicon substrate.

The problem with this wrap around is that tungsten does not adhere to the silicon substrate surface and could readily chip and flake during the handling of the substrate, resulting in particulate contaminants.

An idealized edge cross-section is, therefore, that illustrated in FIG. 1(b) in which all three layers terminate at or close to the same point with respect to the substrate's edge, preferably above the chamber, with the metal layer 4 being the furthest back from the edge of the substrate.

One solution to this problem of unwanted edge deposition is to provide a shadow ring which is located over and masks a narrow, peripheral area of the substrate to prevent deposition thereon. However, this has the disadvantage that the ultimate yield by the substrate is reduced because its usable area is smaller. It is also inappropriate to use a shadow ring in situations where the entire upper surface of the substrate must be deposited on. The shadow ring is also not as successful as might be desired because of wafer warpage and the fact that the volatile deposition gas still tends to migrate under the lip of the shadow ring and deposit unwanted material on the substrate edge and backside.

Another factor which affects the uniformity of the deposition material layer is the uniformity of heating of the wafer. One method of uniformly heating the wafer is to use a heater pedestal for both supporting and heating the wafer. An example of this arrangement is described in the co-pending U.S. patent application Ser. No. 08/200,862 referenced above. In this arrangement, the wafer is supported on a flat supporting surface of a heater pedestal mounted on a vertical stalk within the chamber. The pedestal is heated from within by means of an electrical heating coil, and the wafer, in turn, is heated by the hot supporting pedestal. In order to provide for improved uniformity of heating of the wafer, this arrangement makes provision for a vacuum chuck in which a "vacuum" is drawn at the interface between the underside of this wafer and the flat supporting surface of the pedestal. The resulting pressure differential across the wafer draws the wafer onto the pedestal resulting in improved uniformity of heating of the wafer.

But as a result of this vacuum drawn at the backside of the wafer, processing gas can be drawn around the edge of the wafer and into the interface between the wafer and the pedestal. This can result in unwanted edge and backside deposition even when a shadow ring is located over the wafer. As explained earlier, this unwanted deposition can lead to the generation of particle contaminants. Accordingly, the improved uniformity of heating is accompanied by the possible increase of unwanted edge and backside deposition.

3

The need therefore exists for a method and apparatus for controlling the deposition of materials at or around the edge of a semiconductor substrate during CVD and/or other substrate processing operations.

Further, in some processes, cleaning deposits from components within the chamber is difficult to achieve. In the deposition of Aluminum, for example, the cleaning must be accomplished by physical scrubbing or chemical bathing of individual components.

Such deposits are most likely to occur on surfaces which are immediately adjacent the wafer and on surfaces which are suitably heated.

Accordingly, there is a need to reduce the amount of deposition on such surfaces and make them relatively easily cleaned.

There is a further need for such apparatus to be easily cleanable and serviceable, due to the deposition that inevitably occurs on deposition apparatus and the stresses induced by the high temperatures within the chamber.

SUMMARY OF THE INVENTION

Briefly, therefore, this invention provides for a substrate processing apparatus comprising a processing chamber in which a substrate support is located. The substrate support, which is in the form of a heater pedestal, has a surface dimensioned to receive the substrate, and is circumscribed by a removable purge ring which defines an annulus between itself and the pedestal.

At the outer edge of the pedestal, a purge gas manifold, is formed as a cavity between the purge ring and the pedestal. The lower end of the manifold is sealed by means of a mechanical seal that is formed at process temperature as the pedestal expands from heating and comes into contact with the purge ring's lower edge. The upper end of the manifold opens into the annulus defined by the purge ring and the pedestal. The manifold is arranged so that during processing, purge gas is injected into the manifold and projected toward the edge of a substrate received on the surface of the pedestal. This gas moves upwards through the annulus defined between the purge ring and the substrate support. Consequently, processing gas is prevented from contacting the extreme edge portion of the substrate. This reduces unwanted deposition on the peripheral edge and lower surface of the substrate.

The purge ring is preferably made of a nickel-chromium-iron alloy, such as 316L stainless steel. The purge ring is supported on three ceramic pins which in turn rest on the pedestal. As a result the purge ring is supported clear of the heater pedestal and there is less heat transfer from the pedestal to the purge ring. The purge ring therefore operates at a lower temperature, reducing deposition on the ring.

The purge ring may have wafer guides formed thereon which align the substrate with respect to the substrate support, and the purge ring may also be supported on the pedestal by ceramic locating/support pins which further reduce heat transfer to the ring.

The purge ring may also have a raised upper edge such that when the ring is positioned on the pedestal, a substrate receiving pocket is formed. When the wafer is placed in the pocket, its processing surface would be at or below the surface of the purge ring. In this case, the raised portion of the purge ring would shield the edge of the wafer from direct flow of processing gas.

The receiving surface of the pedestal may further include vacuum ports formed therein, whereby a vacuum can be drawn at the interface between the pocket floor and the underside of a substrate received thereon, thereby causing the substrate to be drawn onto the pedestal to improve processing.

The receiving surface of the pedestal may also have a substrate receiving pocket formed therein, such that a wafer placed in the pocket would have its surface at or below the surface of the pedestal.

The pedestal preferably includes a heater for heating the support whereby a substrate supported thereon is heated by means of conduction.

This invention finds particular application in, but is not limited to, semiconductor wafer processing chambers which process such wafers using a metal CVD process.

A primary advantage of this invention is that it reduces the occurrence of deposition on the edge and backside of the substrate. This in turn reduces particulate contaminants originating from unwanted edge/underside deposition that inadequately adheres to the substrate.

Another advantage of this invention is that it yields a more uniform deposition material layer on the substrate, while simultaneously reducing the incidence of particle generation during processing. By eliminating the shadow ring which touches the substrate during processing, the overall yield of die from the substrates is increased by eliminating the masked edge of the substrate created by the shadow ring.

Yet another advantage of this invention is that the purge ring may easily be removed for wet or mechanical cleaning.

These advantages and further details of the present invention will become apparent to one skilled in the art from the following detailed description when taken in conjunction with the accompanying drawings.

DESCRIPTION OF THE INVENTION

Introduction

Figure 1A:
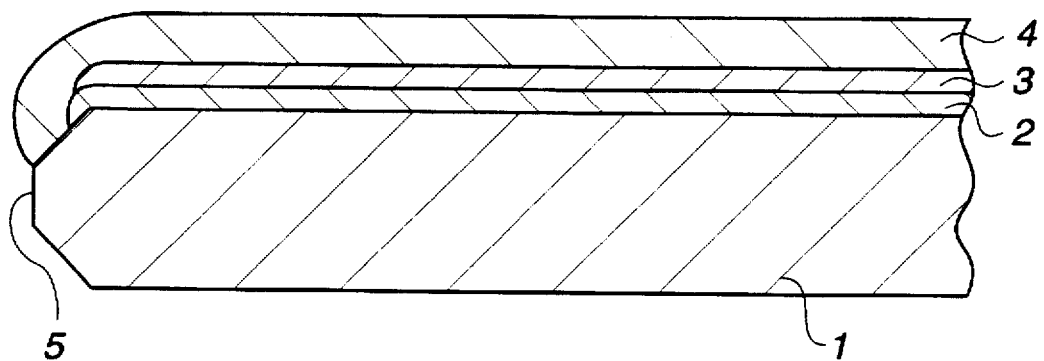
FIGS. 1(a) and 1(b) are partial cross-sections of a semiconductor substrate respectively illustrating non-ideal and ideal deposition of material layers at the edge of the substrate.
Figure 1B:
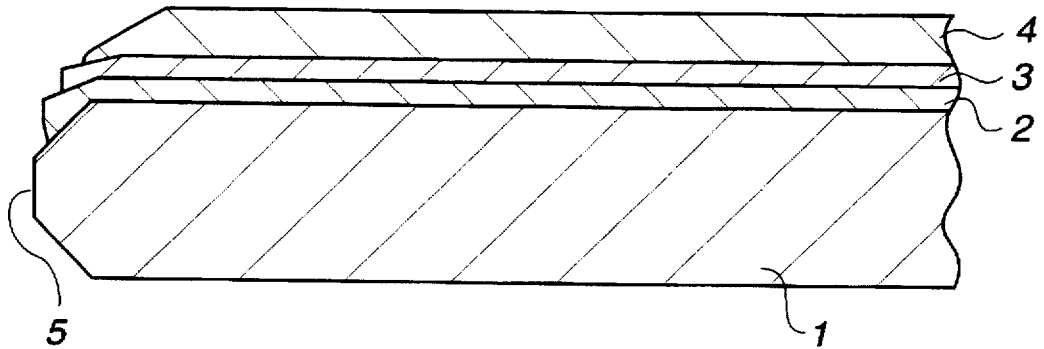
Figure 2:
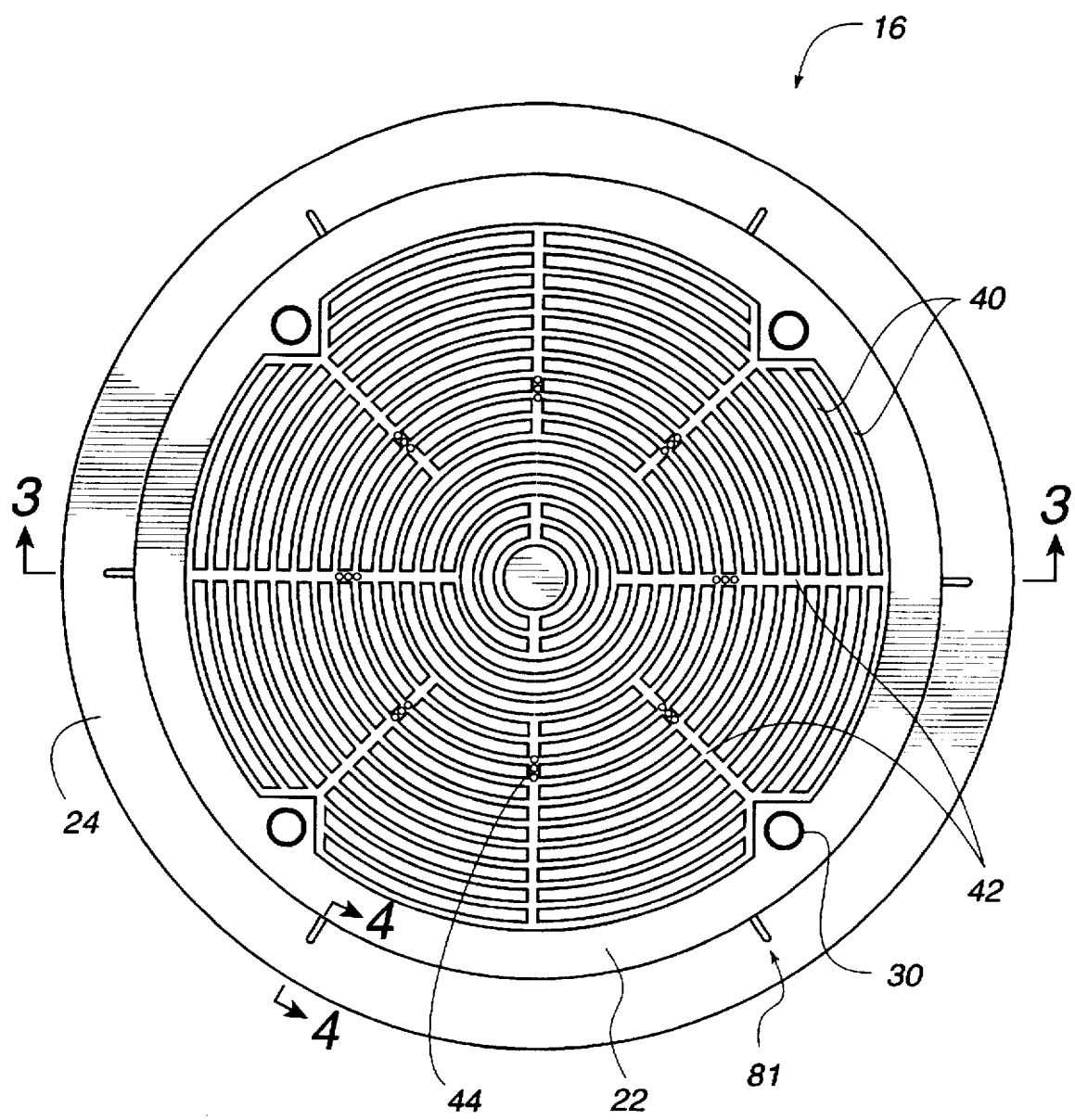
FIG. 2 is a top view of the heater pedestal in the invention.
Figure 3:
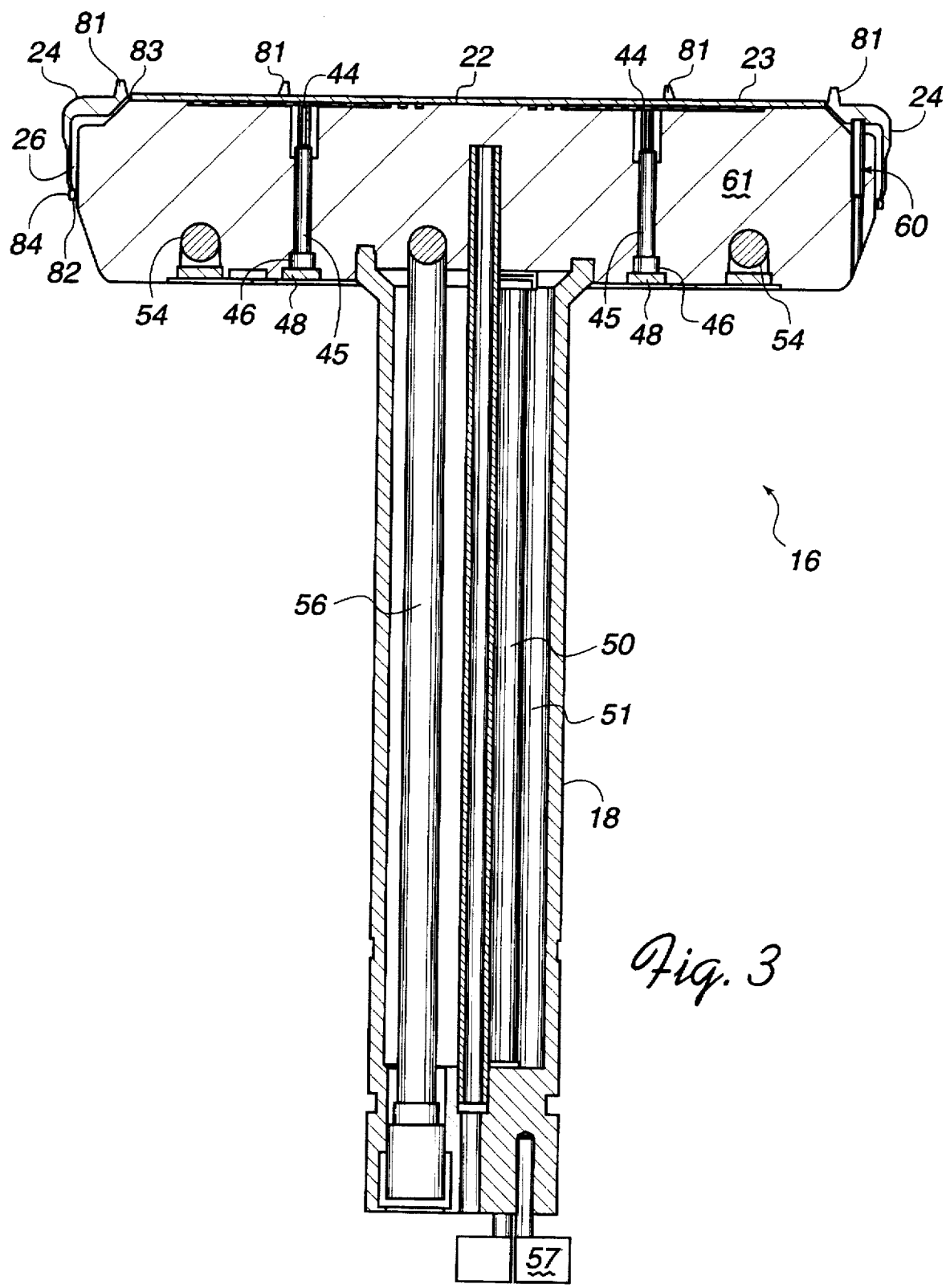
FIG. 3 is a cross-section along line 3—3 in FIG. 2.

To reduce the deposition of material on a semiconductor substrate wafer's underside and edge, a heater pedestal as illustrated in FIGS. 2 and 3 includes edge protection in the form of a circumferential purge gas ring 24 positioned adjacent to the periphery of a wafer (not shown) when a wafer is received on the supporting surface 22 of the pedestal 16. Once the wafer is positioned on the pedestal 16 and processing begins, a continuous flow of purge gas is provided to a purge gas manifold 26 to flow through a purge gap 83 and about the entire edge of the substrate. The purge flow has the effect that little or no deposition occurs on the edge of the substrate, or on the underside of the substrate immediately adjacent to the edge. The resulting configuration of deposited layers of material would resemble that illustrated in FIG. 1(b).

Detailed Description

As illustrated in FIG. 2, the pedestal 16 has an upper supporting face 22 on which a semiconductor wafer 23 (not shown in FIG. 2) can be supported. This face 22 has a plurality of concentric circular grooves 40 formed in it. These concentric grooves 40 are typically 0.21 mm (0.08 inches) wide and 0.38 mm (0.015 inches) deep and 2.97 mm (0.117 inches) apart. They are interconnected by means of radially oriented channels 42. Approximately midway along the length of each radial channel 42 a plurality (24 total) of vacuum ports 44 are formed into the body of the pedestal.

FIG. 2 also illustrates apertures 30 which pass through the body of the pedestal 16. These apertures 30 receive wafer lift fingers (not shown) which operate to lift the wafer clear of the upper face 22 of the pedestal 16 so that the wafer can be removed after processing. This removal of the wafer is achieved by means of a conventional processing apparatus robot arm (not shown) which enters the chamber through a port that is selectively opened through a slit valve. The same robot arm is also used to place wafers in position for processing. The lift fingers are moveable vertically under action of a lifting mechanism which is well known in the art.

In FIG. 3, the heater pedestal 16 is shown to comprise a main body 61 supported by a vertical stalk 18. The vacuum ports 44 of FIG. 2 are in communication, via eight holes 45, with a circular manifold groove 46 formed into the underside of the main pedestal body 61. This groove 46 is sealed at the underside of the pedestal by means of ring plugs 48. The groove 46 is also in communication with a vacuum conduit 50 located within the stalk 18. The conduit 50 communicates with the groove 46 by means of at least one generally horizontal conduit (not shown) within the main body 61 of pedestal 16. Within the stalk 18 are, in addition to the vacuum conduit 50, a purge gas conduit 51, a housing containing a thermocouple (not shown) for measuring the temperature of the pedestal, and a conduit 56 for supplying power to a heating element 54 located within the main body 61 of the pedestal 16.

A removable purge ring 24 circumscribes the supporting surface 22 and rests on three ceramic supporting pins 60 which are spaced apart at the perimeter of the pedestal 16. In this position, and as shown in detail in FIG. 4, the angled inner surface 25 of the purge ring 24 together with the angled outer face 27 of the pedestal forms an annulus 80. The annulus 80 directs purge gas into a purge gap 83 defined between the wafer 23 and the ring 24. The gap 83 is dimensioned to allow sufficient flow of purge gas to prevent deposition on the edge and underside of the wafer. In one embodiment of the invention, the purge gap 83 is 0.023 to 0.030 inches when the apparatus is at operating temperature. This configuration of the annulus 80 and the purge gap 83 provides a relatively constant supply of purge gas about the entire perimeter of the substrate. The annulus 80 is supplied by a purge gas manifold 26 in the form of a cavity encircling the entire outer edge of the main body 61 of the pedestal 16.

Figure 4:
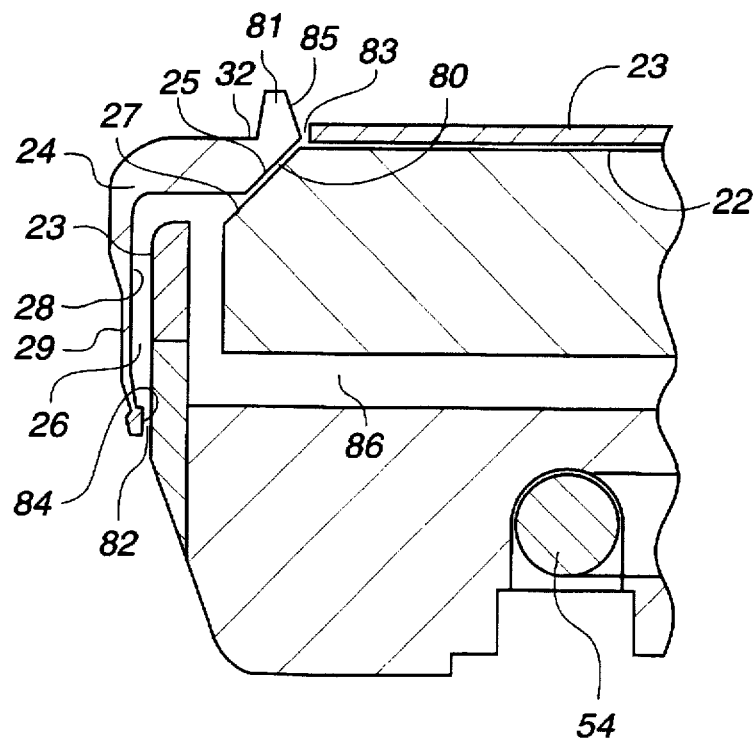
FIG. 4 is an enlarged partial sectional view of the upper portion of the pedestal and purge ring, taken along line 4—4 in FIG. 2.

As further shown in FIG. 4, the inner surface 28 of the purge ring 24 together with the peripheral face 23 of the pedestal 16 forms the purge gas manifold 26. The gas manifold 26 communicates with the purge gap 83 through the annulus 80. At room temperature it is open at its lower end and a gap exists at the interface 82 between the sealing edge 84 of the purge ring 24 and the peripheral surface 23 of the pedestal 16. As described below, in operation, this gap, between the sealing edge 84 of the purge ring and the peripheral surface 23 of the main body 61 of the pedestal, is closed. The gas manifold 26 is supplied with purge gas by eight purge gas outlets 86 formed in the main body 61 of the pedestal 16. These purge gas outlets 86 are in communication with a purge gas supply 57 via a purge gas conduit 51 (shown in FIG. 3).

Because the purge ring 24 is freely removable at room temperature (without loosening any fasteners) when a gap exists at the interface 82, wet and/or mechanical cleaning to remove deposition is facilitated. This same purge ring 24 forms a tight mechanical seal at the interface 82 during processing at elevated temperatures, in the manner described below.

Figure 5:
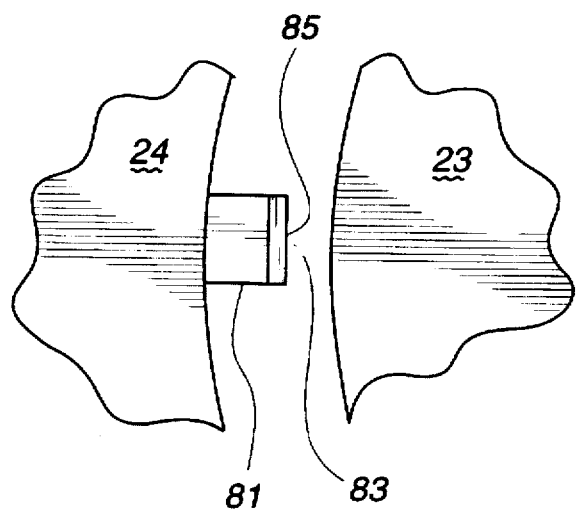
FIG. 5 is a plan view showing details of a wafer guide.

Proper positioning of the wafer on the receiving surface 22 is important, as any gross misalignment places a portion of the wafer edge in a position which obstructs gas flowing out from the purge gap 83. To aid in proper wafer positioning, and as shown in greater detail in FIG. 5, the purge ring 24 has protrusions in its upper surface 32 at its inner circumference in the form of wafer guides 81. These wafer guides 81 have angled inner faces 85 which capture the outer edge of the wafer 23 and serve to align it when it is received on the surface 22 of the pedestal 16. Misalignment of the wafer 23 results in engagement of one or more of the wafer guides by the edge of the wafer. These pins serve to align the entire circumference of the wafer with respect to the purge ring 24 to define the purge gap 83 around the entire edge of the wafer. Use of the wafer guides 81 thus allows tolerance of slight inaccuracies in the positioning of the wafer by the robot blade. In an embodiment of the invention, there are six such wafer guides 81 spaced at equal intervals on the upper surface 32 of the purge ring 24, and positioned to provide approximately 0.012 to 0.013 inches of tolerance between the guides 81 and the outer edge of the wafer 23.

In a preferred embodiment, the purge ring 24 is made from a nickel-chromium-iron alloy such as 316L stainless steel, but may be made of a material which also has a lower coefficient of thermal expansion than the material of which the main body 61 is made. The reasons for this will become apparent below. It is also preferred that the supporting pins 60 on which the purge ring 24 rests be designed to minimize heat transfer from the pedestal 16 to the purge ring 24. This permits the purge ring 24 to operate at a lower temperature and thus reduce the amount of deposition thereon. The reduced deposition on the purge ring 24 allows a greater time interval between downtimes for cleaning and other maintenance. Thus, in order to reduce heat transfer to the purge ring 24, the supporting pins 60 are dome shaped to minimize contact area and made of a ceramic such as alumina which has a poor thermal conductivity.

Additionally, the purge ring 24 has a thin walled section 29 which, due to its reduced cross-sectional area, reduces heat transfer from the sealing edge 84 to the rest of the purge ring, and in particular to the upper surface 32.

Although the figures illustrate an embodiment suitable for use with a circular wafer, it should be noted that the purge gap 83 should follow the perimeter of the substrate. Accordingly, if a non-circular substrate (such as a wafer with a "wafer flat" formed in it) is being processed, the gap should be formed to follow the irregular perimeter. Furthermore, though the illustrated embodiment comprises a flat wafer supporting surface, the invention may be used with substrate supports having different configurations, such as a susceptor having a deep pocket for supporting the substrate. Additionally, the purge ring itself may be configured such that it completely surrounds the periphery of the wafer to produce a pocket in which the wafer is placed.

During processing, the robot blade places an appropriately dimensioned semiconductor wafer on the wafer lift fingers which then lower the wafer onto the upper surface 22 of the pedestal 16. As the wafer is lowered, any misalignment of the wafer will be corrected by the wafer guides 81 which nudge it into position. The semiconductor wafer thus rests on the upper surface 22. In this position, the edge of the wafer will be very close to the purge gap 83, as the wafer guides 81 on the inner circumference of the purge ring 24 are positioned to give approximately 0.080 inches of tolerance with respect to the wafer.

A typical metal deposition process has two discrete deposition steps. During the first step, lasting about thirty (30) seconds, the pressure in the chamber is reduced to about 0.6 kPa (4.5 Torr) and a metal deposition gas introduced into the chamber. This step, known as a nucleation step, results in a very thin layer of metal being deposited on the wafer. This thin layer serves as a base layer onto which further layers of metal are deposited.

During the second deposition step (last less than 60 seconds and during which most of the metal is deposited), a "vacuum" is drawn at the interface between the wafer and the upper face 22 of the pedestal 16. This is achieved by drawing a vacuum to about 2.7 kPa (20 Torr) through the vacuum ports 44 via the conduit 50 and the grooves 46. The drawing of this vacuum results in a pressure of about 2.7 kPa in all the concentric grooves 40. As the interior pressure of the chamber during processing is approximately 10.7 to 12 kPa (80 to 90 Torr), a pressure differential exists across the wafer. This causes the wafer to be drawn against the upper face 22 of the pedestal 16. The advantage of this tight contact is that heat from the pedestal is more uniformly transmitted from the pedestal to the wafer. This leads to a uniform heating of the wafer and, therefore, improved deposition of metal on the wafer surface.

The pedestal 16, in turn, is resistively heated by means of the electrically powered heating coil 54 mounted within the body of the pedestal 16. The coil 54 is supplied with electrical power along a rigid, stainless steel connecting stem 56 located within the body of the stalk 18. Although only one coil is shown in this figure, more than one coil could be used or even multiple heating elements which are nested together but powered separately.

When the pedestal 16 is heated, the main body 61, which is typically made of aluminum, expands due to increased temperature. The purge ring 24, which is made of stainless steel having a lower temperature coefficient of linear expansion and is at a lower temperature, does not expand as much. The peripheral face 23 of the pedestal thus comes into contact with the sealing edge 84 of the purge ring 24, creating a mechanical seal at the interface 82 between the purge ring and the pedestal. The gas manifold 26 is now in communication with only the purge gap 83 and the purge gas outlets 86.

During the second deposition step, an inert purge gas, typically argon, is supplied at a flow rate of approximately two liters per second from the purge gas supply 57 at approximately 207 kPa (30 p.s.i.) and flows through a flow control device, such as a mass flow controller. This control device causes the pressure in the purge gas to drop by about 25% to 33%. Additional pressure drops occur in the gas as it moves through the purge gas outlets 86, towards and into purge gas manifold 26. Nonetheless, the pressure of the purge gas is still great enough in the gas manifold 26 to substantially prevent process gas from migrating into this manifold via the purge gap 83. From this manifold 26, the purge gas flows out through the purge gap 83. Once the purge gas has flowed out, it enters the processing chamber to be exhausted through standard exhausts in the chamber. If supplied at all, the purge gas is supplied during the first deposition step at approximately 250 milliliters (standard cubic centimeters) per minute.

The supply of this purge gas has a particularly advantageous effect in that it substantially reduces or eliminates deposition of metal on the edge and outer portion of the underside of the wafer. It is believed that the deposition gas is removed from the vicinity of the edge of the wafer by the flow of the purge gas. This occurs because the purge gas flows out continually and at high mass flow rates through the purge gap 83, effectively preventing diffusion of deposition gas into the vicinity of the wafer edge.

Although the present invention has been described above in terms of a specific embodiment (that of an apparatus for use in a metal CVD process), it is anticipated that alterations and modifications thereof will no doubt become apparent to those skilled in the art. Additionally, although the invention has been described for use in a thermal CVD chamber, the components herein are equally suited for use in plasma deposition and other substrate processing operations. It is therefore intended that the following claims be interpreted as covering all such alterations and modifications as fall within the true spirit and scope of the invention.

What is claimed is:

1. An apparatus for inhibiting a process fluid from contacting a portion of a substrate, comprising:
    (a) a substrate support for supporting the substrate in a processing chamber;
    (b) a ring circumscribing the substrate and the substrate support, the ring configured to be separated from a periphery of the substrate support within a characteristic temperature range,
    (c) a purge fluid manifold through which a purge fluid is delivered to a region between the ring and the substrate:
    (d) a first purge fluid exit in communication with the region between the ring and the substrate; and
    (e) a second purge fluid exit configured to be obstructed, by the ring and substrate support coming into circumferential contact, within a processing temperature range.

2. An apparatus as in claim 1 wherein the characteristic temperature range is below the processing temperature range.

3. An apparatus as in claim 1, wherein the ring includes a material having a different coefficient of thermal expansion than that of the substrate support.

4. An apparatus as in claim 3 wherein the material has a smaller coefficient of thermal conductivity than that of the substrate support.

5. An apparatus as in claim 1 further comprising at least one ring support configured to reduce heat transfer between the substrate support and the ring.

6. An apparatus as in claim 5 wherein a contact area, between the ring support and at least one of the ring and the substrate support, is smaller than at least one cross-section through the ring support.

7. An apparatus as in claim 5 wherein the ring support has a lower thermal conductivity than that of the substrate support.

8. An apparatus as in claim 5 wherein the ring support is configured to align the ring with respect to the substrate support.

9. A method for inhibiting a process fluid from contacting a portion of a substrate supported on a substrate support in a processing chamber, comprising the steps of:
    (a) circumscribing the substrate support and substrate with a ring configured to be circumferentially separated from the substrate support within a characteristic temperature range;

(b) delivering a purge fluid into a purge manifold having at least one purge fluid exit between the substrate support and the ring; and (c) sealing the at least one purge exit by bringing the ring and the substrate support into contact, within a processing temperature range.

10. A method as in claim 9 wherein the characteristic temperature range is below the processing temperature range.

11. A method as in claim 9 wherein bringing the ring and substrate support into contact includes thermally bringing together the ring and the substrate support.

12. A method as in claim 11 wherein thermally drawing together the ring and the substrate support includes thermally expanding the substrate support against the ring.

13. A method as in claim 9 further comprising supporting the ring in a manner for inhibiting heat transfer between the substrate support and the ring.

14. A method as in claim 13 wherein supporting the ring includes providing a contact area, between a ring support and at least one of the ring and the substrate support, that is smaller than at least one cross-section through the ring support.

15. A method as in claim 13 wherein supporting the ring includes using a ring support that is less thermally conductive than the substrate support.

16. A method as in claim 13 wherein supporting the ring includes aligning the ring with respect to the substrate support.

* * * * *

UNITED STATES PATENT AND TRADEMARK OFFICE
CERTIFICATE OF CORRRECTION

PATENT NO. : 5,766,365
DATED : June 16, 1998
INVENTOR(S) : Umotoy et al It is certified that error appears in the above-identified patent and that said Letters Patent is hereby corrected as shown below:

On the title page, item [56] add the following

FOREIGN PATENT OR PUBLISHED FOREIGN PATENT APPLICATION

| | | DOCUMENT NUMBER | | | | | | PUBLICATION DATE | COUNTRY OR PATENT OFFICE | CLASS | SUBCLASS | TRANSLATION YES | NO |
|---|---|---|---|---|---|---|---|---|---|---|---|---|---|
| | | EP | A | 0 | 4 | 97 | 2 | 67 | 5/8/92 | EPO | | | | |
| | | EP | A | 0 | 6 | 19 | 3 | 81 | 12/10/94 | EPO | | | | |
| | | | | | | | | | | | | | | |

Signed and Sealed this

Sixth Day of April, 1999

Attest:

Q. TODD DICKINSON

*Attesting Officer*

*Acting Commissioner of Patents and Trademarks*